US 6,730,534 B2

(12) United States Patent
Arima

(10) Patent No.: US 6,730,534 B2
(45) Date of Patent: May 4, 2004

(54) METHOD OF MANUFACTURING THREE-DIMENSIONAL STRUCTURE AND METHOD OF MANUFACTURING OSCILLATOR

(75) Inventor: Michitsugu Arima, Kamiina-gun (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/195,870

(22) Filed: Jul. 15, 2002

(65) Prior Publication Data

US 2003/0022516 A1 Jan. 30, 2003

(30) Foreign Application Priority Data

Jul. 24, 2001 (JP) ........................................ 2001-223479

(51) Int. Cl.[7] ........................ H01L 21/00; H01L 21/302
(52) U.S. Cl. ......................... 438/50; 438/52; 438/738; 216/99
(58) Field of Search ............................. 438/50, 52, 53, 438/736, 738, 737, 743, 751, 753, 756; 216/72, 79, 80, 95, 99

(56) References Cited

U.S. PATENT DOCUMENTS

| 4,670,092 A | * | 6/1987 | Motamedi ................... 438/52 |
| 4,670,969 A | * | 6/1987 | Yamada et al. .............. 438/53 |
| 4,699,006 A | * | 10/1987 | Boxenhorn ................ 73/514.15 |
| 4,851,080 A | * | 7/1989 | Howe et al. .................. 438/53 |
| 4,882,933 A | * | 11/1989 | Petersen et al. .......... 73/514.13 |
| 4,893,509 A | * | 1/1990 | MacIver et al. .......... 73/514.29 |
| 5,006,487 A | * | 4/1991 | Stokes ......................... 438/52 |
| 5,198,390 A | * | 3/1993 | MacDonald et al. ........... 438/52 |
| 5,310,449 A | * | 5/1994 | Henderson ................... 438/53 |
| 5,343,064 A | * | 8/1994 | Spangler et al. ............ 257/350 |
| 5,490,034 A | * | 2/1996 | Zavracky et al. ......... 361/283.4 |
| 5,629,244 A | * | 5/1997 | Matsuzaki ................... 438/52 |
| 5,959,208 A | * | 9/1999 | Muenzel et al. ......... 73/514.32 |
| 6,188,504 B1 | | 2/2001 | Murakami et al. |
| 6,238,946 B1 | * | 5/2001 | Ziegler ........................ 438/50 |
| 6,251,698 B1 | * | 6/2001 | Lefort et al. .................. 438/22 |
| 6,293,149 B1 | * | 9/2001 | Yoshida et al. .......... 73/514.01 |
| 6,413,793 B1 | * | 7/2002 | Lin et al. ..................... 438/50 |
| 6,465,271 B1 | * | 10/2002 | Ko et al. ..................... 438/48 |

FOREIGN PATENT DOCUMENTS

| JP | 5-264577 | 10/1993 |
| JP | 11-242180 | 9/1999 |
| WO | WO-00/02028 | * 1/2000 |

* cited by examiner

*Primary Examiner*—Matthew Smith
*Assistant Examiner*—Lex H. Malsawma
(74) *Attorney, Agent, or Firm*—Scully, Scott, Murphy & Presser

(57) ABSTRACT

The present invention provides a method of manufacturing a three-dimensional structure having portions different in thickness, the method comprising forming a laminated structure, which comprises at least two layers to be processed and at least one inner mask interposed between the layers, the layers and the inner mask being joined together, such that the laminated structure has top and bottom major surfaces, forming an outer mask on at least one of the major surfaces of the laminated structure, selectively etching the layers from one of the major surfaces of the laminated structure through the outer mask to expose the inner mask and then through the inner mask, so that the portions different in thickness are formed by one etching process.

7 Claims, 19 Drawing Sheets

METHOD OF MANUFACTURING THREE-DIMENSIONAL STRUCTURE AND METHOD OF MANUFACTURING OSCILLATOR

CROSS-REFERENCE TO RELATED APPLICATIONS

This application is based upon and claims the benefit of priority from the prior Japanese Patent Application No. 2001-223479, filed Jul. 24, 2001, the entire contents of which are incorporated herein by reference.

BACKGROUND OF THE INVENTION

1. Field of the Invention

The present invention relates to a method of manufacturing a three-dimensional structure including a plurality of portions different in thickness, for example, an oscillator applied to an optical scanner.

2. Description of the Related Art

U.S. Pat. No. 6,188,504 discloses an optical scanner including a three-dimensional structure called as an oscillator, which is produced by selectively etching a semiconductor substrate. FIG. 18 shows the configuration of this optical scanner.

As shown in FIG. 18, the optical scanner comprises an oscillator 510 having a movable plate 512, a support frame 514 surrounding the movable plate 512, and a pair of elastic members 516 connecting the movable plate 512 and the support frame 514, a coil 522 extending along the periphery of the movable plate, a pair of wires 524 extending through the elastic members 516, respectively, a pair of feeding pads 526 formed on the support frame 514, and magnets 532 fixed to the support frame 514. The movable plate 512 has a reflecting surface 528 formed thereon to reflect a beam of light. The wires 524 have ends connected to the ends of the coil 522 and the other ends connected to the feeding pads 526. The elastic members 516 comprise an insulating elastic film such as polyimide resin. The insulating elastic film extends also over the movable plate 512 to function as an interlayer insulating film, which insulates the coil 522 from the wires 524.

In FIG. 18, when an AC voltage is applied to the pair of feeding pads 526, an AC current flows through the coil 522. Then, Lorentz force is generated owing to the interaction between the current flowing through the coil 522 and magnetic fields generated by the magnets 532. Thus, the movable plate 512 is subjected to a couple of forces exerted around an axis thereof passing through the interior of the elastic members 516. The directions of these forces depend on the direction of the current flowing through the coil 522. Since the AC current flows through the coil 522, the movable plate 512 oscillates around the axis passing through the interior of the elastic members 516. The oscillation of the movable plate 512 scans a beam of light reflected by the reflecting surface 528 of the movable plate 512.

Now, the process steps of manufacturing the oscillator 510 of this optical scanner 510 will be described with reference to FIGS. 19 to 22.

First, as shown in FIG. 19, a silicon nitride film 544 is formed on the major surfaces (top and bottom surfaces) of a silicon substrate 542. Then, the silicon nitride film on the bottom surface side is selectively etched to form a mask 548 used to form the movable plate and the support frame.

Then, as shown in FIG. 20, the coil 522, a polyimide film 552, the wires 524 and feeding pads 526, a polyimide film 554, and a polyimide etching mask 556 are sequentially formed on the silicon nitride film on the top surface side of the silicon substrate 542. An end of each of the wires 524 is electrically connected to a corresponding end of the coil 522 through a corresponding one of via holes formed in the polyimide film 552.

Subsequently, as shown in FIG. 21, with the top surface side of the silicon substrate 542 sealed, the silicon substrate 542 is selectively etched through the mask 548 from the bottom surface side with TMAH (Tetramethyl ammonium hydroxide) or the like, so that its portion that is not covered by the mask 548 is removed, to form the movable plate 512 and the support frame 514.

Furthermore, the polyimide films 552 and 554 are etched through the polyimide etching mask 556 to form the elastic members 516 (see FIG. 22). Finally, the polyimide etching mask 556 and the remaining silicon nitride film 544 and 548 are removed to obtain the oscillator 510 for an optical scanner, shown in FIG. 22.

In the oscillator 510 for an optical scanner, shown in FIG. 22, the thickness of each of the movable plate 512 and the support frame 514 is always the same as that of the silicon substrate 542, as is apparent from the method of manufacturing the oscillator. If the movable plate 512 is miniaturized, i.e. a dimension of the movable plate 512 such as the width W or length A thereof is reduced, the area of the coil decreases relatively to the volume of the movable plate 512. Consequently, the oscillator or scanner is less efficiently driven.

As the movable plate 512 is miniaturized, the dimension of the movable plate 512 such as the width W or length A thereof approaches the thickness of the silicon substrate 542. Accordingly, the movable plate 512 is shaped like a block as shown in FIG. 23. As a result, the position of the center of gravity 564 of the movable plate deviates from an oscillation axis 562. That is, as the movable plate 512 is miniaturized, the distance D from the oscillation axis 562 to the position of the center of gravity increases. This may cause unwanted vibration modes to be generated during driving.

Further, with the TMAH-based etching, which is most commonly applied to silicon etching, etching speed varies depending on the plane direction of silicon. Accordingly, the plane direction of silicon is selected according to the shape of a structure to be produced. A wafer with a plane direction (100) is used to form the movable plate described previously. In this case, the sides of the movable plate are tapered as shown in FIG. 23. The width WL or length LL of the top surface of the movable plate, in which the coil is formed, equals the width WS or length LS, respectively, of a mask 566 used to form the movable plate plus double the width (length) LT of the tapered portion. Therefore, the etching process with TMAH does not enable the formation of a movable plate in which the width WL or length LL of the top side is smaller than 2×LT.

The value of LT depends on the thickness of the silicon substrate. Accordingly, a thin silicon substrate 542 may be used to form a small movable plate. However, the thin silicon substrate 542 is not stiff and is thus not strong enough for handling during production. Further, the support frame 514 formed is as thick as the silicon substrate 542 used. Consequently, the produced oscillator 510 is not strong and is thus difficult to handle.

Therefore, with the method of manufacturing the oscillator 510 (three-dimensional structure) described previously, it is difficult to produce a very small movable plate (member).

BRIEF SUMMARY OF THE INVENTION

It is a main object of the present invention to provide a method of manufacturing a three-dimensional structure, the method allowing portions different in thickness to be formed by a single etching process.

It is another object of the present invention to provide a method of manufacturing a three-dimensional structure, such as an oscillator, the method allowing a very small member, such as a movable plate, to be formed by wet etching.

It is yet another object of the present invention to provide a method of manufacturing an oscillator, the method allowing production of an oscillator that can be efficiently driven even with a small movable plate.

It is still another object of the present invention to provide a method of manufacturing an oscillator, which hardly generates unwanted vibration modes even with a small movable plate.

The present invention provides a method of manufacturing a three-dimensional structure (for example, an oscillator applied to an optical scanner or an acceleration sensor) having portions different in thickness, the method comprising: forming a laminated structure, which comprises at least two layers to be processed and at least one inner mask interposed between the layers, the layers and the inner mask being joined together, such that the laminated structure has top and bottom major surfaces; forming an outer mask on at least one of the major surfaces of the laminated structure; selectively etching the layers from one of the major surfaces of the laminated structure through the outer mask to expose the inner mask and then through the inner mask, so that the portions different in thickness are formed by one etching process.

Initially, portion that is not covered with the inner mask provided outside the laminated structure is selectively etched. Then, the inner mask provided inside the laminated structure is exposed. Subsequently, portion that is not covered with the inner mask is selectively etched. As a result, a three-dimensional structure having a thicker portion and a thinner portion is formed. The thickness of the thinner portion depends on the position of the inner mask in the laminated structure. Therefore, the thickness of the thinner portion of the three-dimensional structure can be independently and accurately controlled.

According to the present invention, a method of manufacturing a three-dimensional structure is provided, the method allowing portions different in thickness to be formed by a single etching process. Further, according to the present invention, an arbitrary portion of the structure can be formed to have an arbitrary thickness. Therefore, a very small member can be formed by wet etching.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

Embodiments of the present invention will be described below with reference to the drawings.

First Embodiment

A method of manufacturing an oscillator for an optical scanner, a three-dimensional structure according to a first embodiment of the present invention, will be described with reference to FIGS. 1 to 9.

Figure 1:
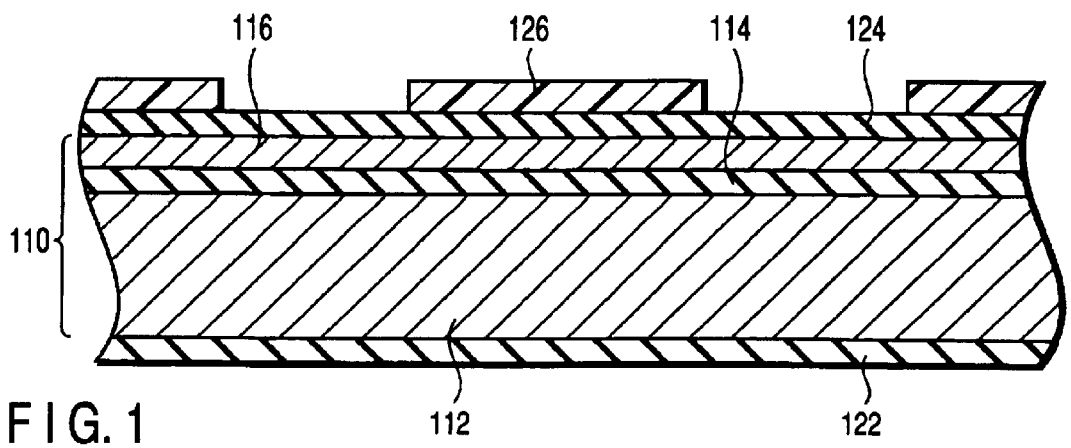
FIG. 1 is a side sectional view showing the first step of a method of manufacturing an optical scanner oscillator, a three-dimensional structure according to a first embodiment of the present invention.

First, as shown in FIG. 1, an SOI (Silicon on Insulator) substrate 110 is provided, which has a support layer 112, a buried oxide film layer 114, and an active layer 116, which are all joined together. Oxide films 124 and 122 are formed on the major surfaces of the SOI substrate 110, that is, the outer or non-jointed surfaces of the active layer 116 and support layer 112, respectively. Then, a resist pattern 126 is formed on the oxide film 124. The active layer 116 of the SOI substrate 110 has a thickness corresponding to a movable plate to be formed.

Figure 2:
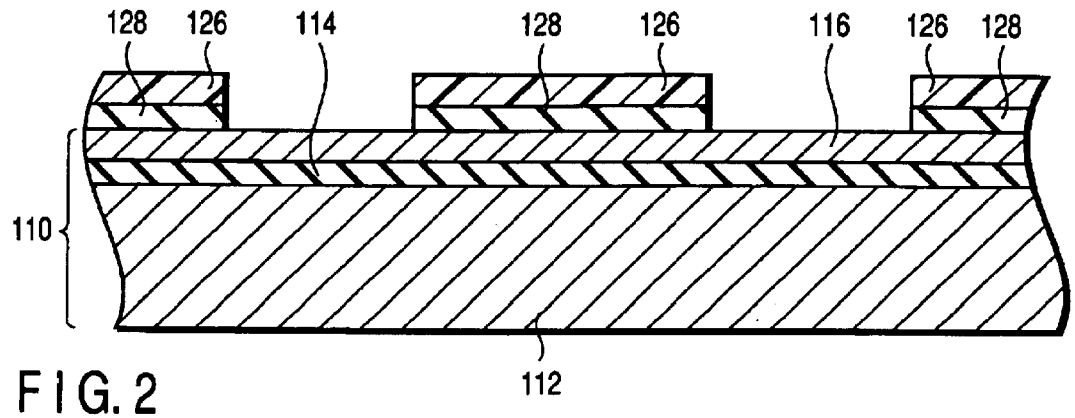
FIG. 2 is a side sectional view showing that step of the method of manufacturing the oscillator according to the first embodiment which follows the step shown in FIG. 1.

Then, as shown in FIG. 2, the portions of the oxide film 124 that are not covered with the resist pattern 126 are removed with buffered hydrofluoric acid or the like to form a mask 128.

Figure 3:
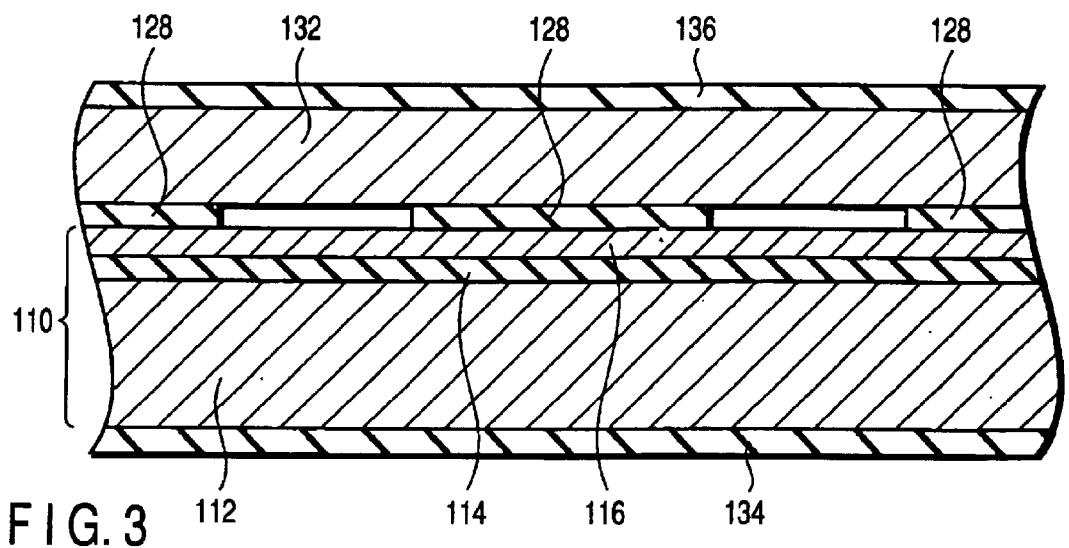
FIG. 3 is a side sectional view showing that step of the method of manufacturing the oscillator according to the first embodiment which follows the step shown in FIG. 2.

Subsequently, the resist pattern 126 is removed, and as shown in FIG. 3, a silicon substrate 132 is brought into contact with the mask 128 of the resulting structure. Then, a weight is applied to the structure to temporarily join the silicon substrate 132 and the mask 128. In other words, the SOI substrate 110 and the silicon substrate 132 are joined through the mask 128.

During this step, immediately before the temporary joining, natural oxide films, which are formed on both substrates of silicon exposed, are desirably removed with hydrofluoric acid or the like. The joining operation may be performed in the atmosphere, but is preferably performed in a reduced pressure atmosphere if voids are generated in the interface between the substrates because of the shape of the mask 128 or the like.

Furthermore, the temporarily joined structure is thermally treated in an oxidizing atmosphere to completely join the two substrates. Moreover, the structure is thermally oxidized to form oxide films 136 and 134 on the outer surfaces of the joined structure, i.e. the non-joint surfaces of the SOI substrate 110 and silicon substrate 132, as shown in FIG. 3.

Figure 4:
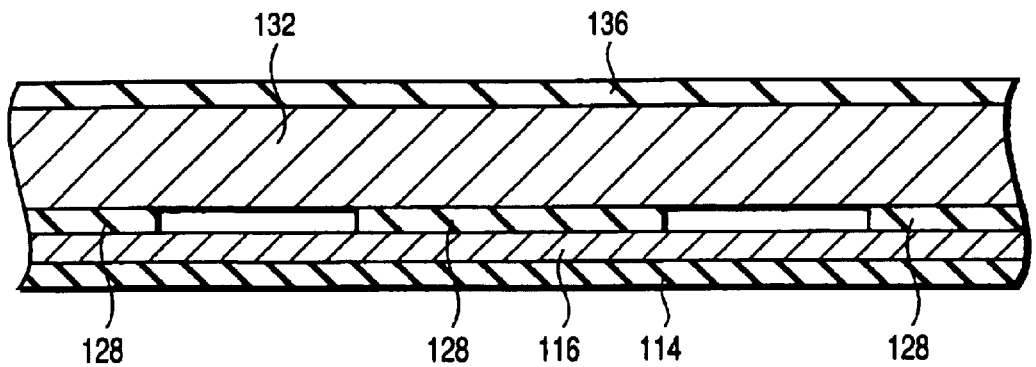
FIG. 4 is a side sectional view showing that step of the method of manufacturing the oscillator according to the first embodiment which follows the step shown in FIG. 3, and also showing a laminated structure comprising two silicon layers and one inner mask interposed between these silicon layers.

Then, the oxide film 134, which is formed on the support layer 112 of the SOI substrate 110, is removed. The oxide film 136 that remains on the non-joint surface of the silicon substrate 132 functions as a protective film against etching in the next step. Subsequently, the support layer 112 is removed with TMAH or the like to obtain a structure with the mask 128 buried between the silicon substrate 132 and the active layer 116 as shown in FIG. 4. That is, a laminated structure is formed, which comprises the two silicon layers to be processed, and the inner etching mask interposed between the silicon layers.

Figure 5:
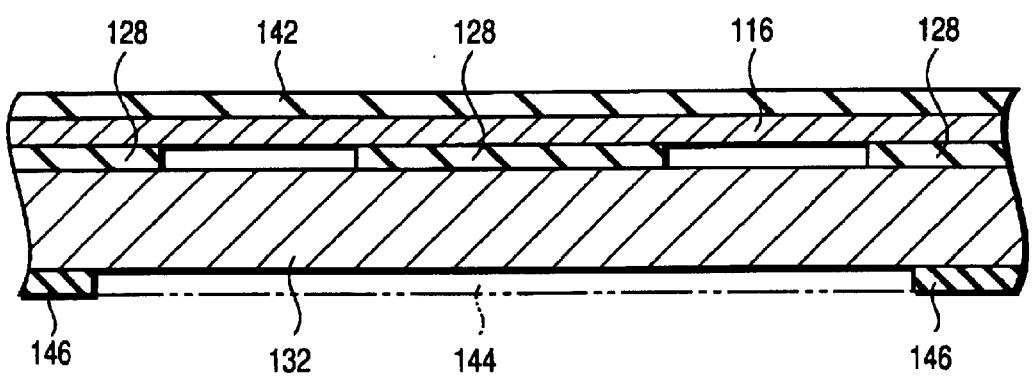
FIG. 5 is a side sectional view showing that step of the method of manufacturing the oscillator according to the first embodiment which follows the step shown in FIG. 4, and also showing the laminated structure upside down compared to FIG. 4, the laminated structure having an outer mask formed on a major surface thereof.
Figure 6:
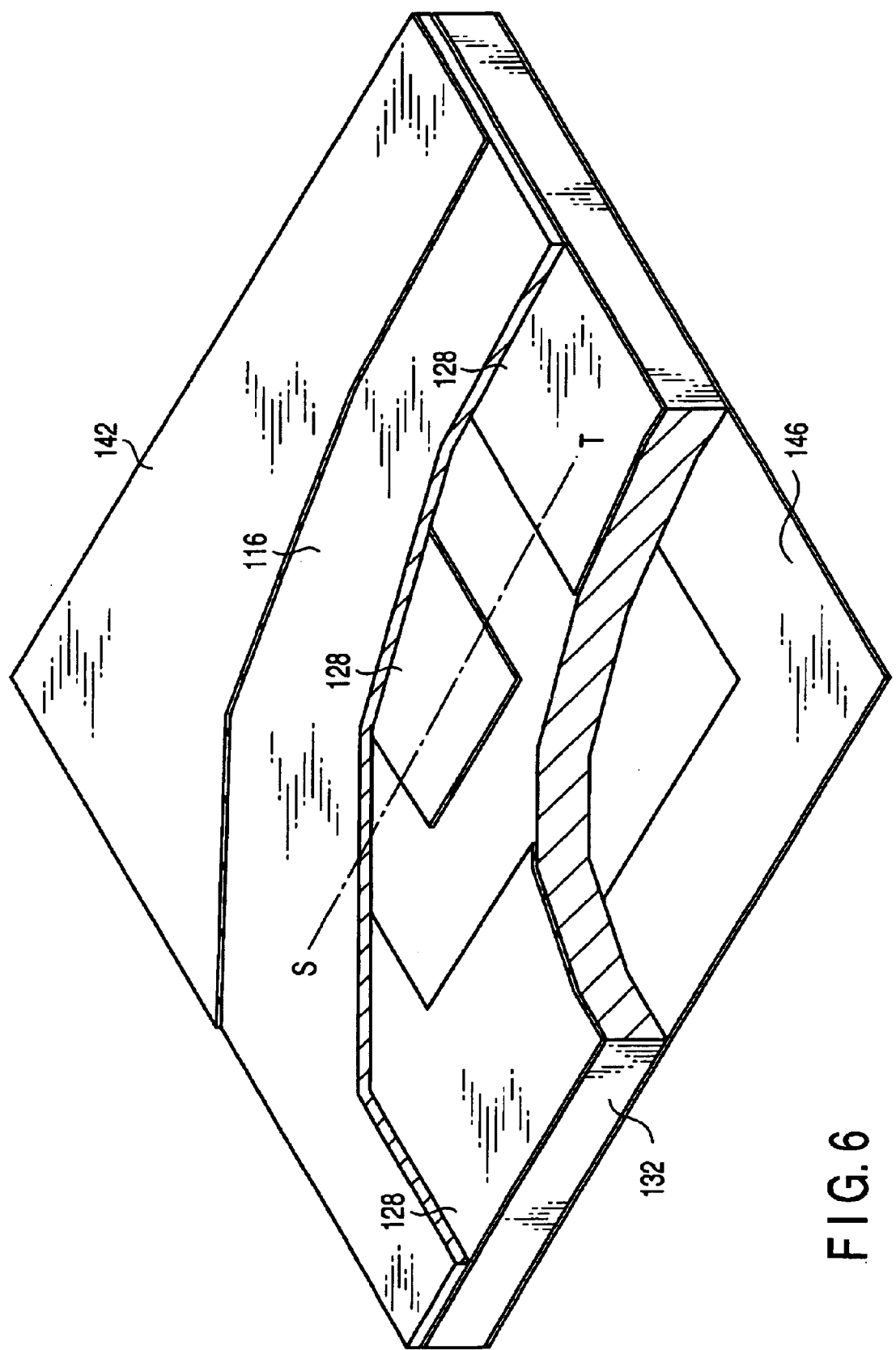
FIG. 6 is a partially sectional perspective view of the laminated structure shown in FIG. 5, which shows a cross section taken along line S-T in FIG. 6.

Then, the oxide film 136 and the buried oxide film layer 114 are removed. Thereafter, silicon nitride films 142 and 144 are formed on the outer or non-joint surfaces of silicon substrate 132 and active layer 116, respectively. Furthermore, the silicon nitride film 144 is selectively etched to form an outer mask 146 on the non-joint surface of the silicon substrate 132, as shown in FIGS. 5 and 6.

Figure 7:
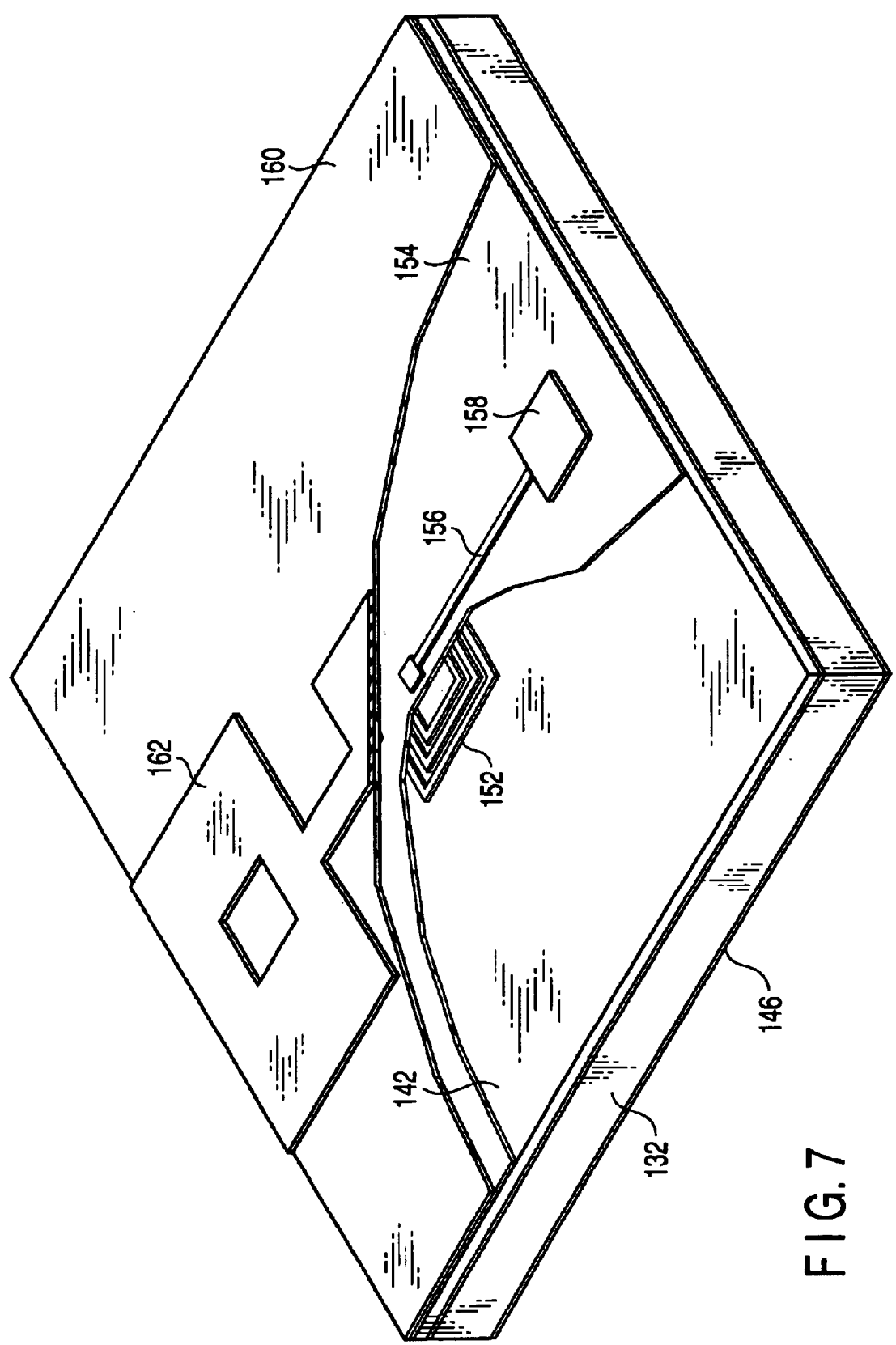
FIG. 7 is a partially sectional perspective view showing that step of the method of manufacturing the oscillator according to the first embodiment which follows the step shown in FIGS. 5 and 6.

Then, as shown in FIG. 7, a coil 152, a polyimide film 154, wires 156 and feeding pads 158, a polyimide film 160, and a polyimide etching mask 162 are sequentially formed on the surface of the silicon nitride film 142 that is in contact with the active layer 116. Although not shown, ends of the wires 156 are electrically connected to corresponding ends of the coil 152 through via holes formed in the polyimide film 154.

Next, the structure's surface on which the coil 152 and others are formed is sealed. Then, the resulting structure is etched through the outer mask 146 with TMAH or the like from the surface that is closer to the silicon substrate 132. Initially, the silicon substrate is selectively etched through the outer mask 146, so that its portion that is not covered with the outer mask 146 is removed, and then the inner mask is exposed. After the inner mask 128 has been exposed, the active layer 116 is etched through the inner mask 128, so that only its portion that is not covered with the inner mask 128 is removed. As a result, as shown in FIG. 8, a support frame 174 and a movable plate 172 are formed.

Figure 8:
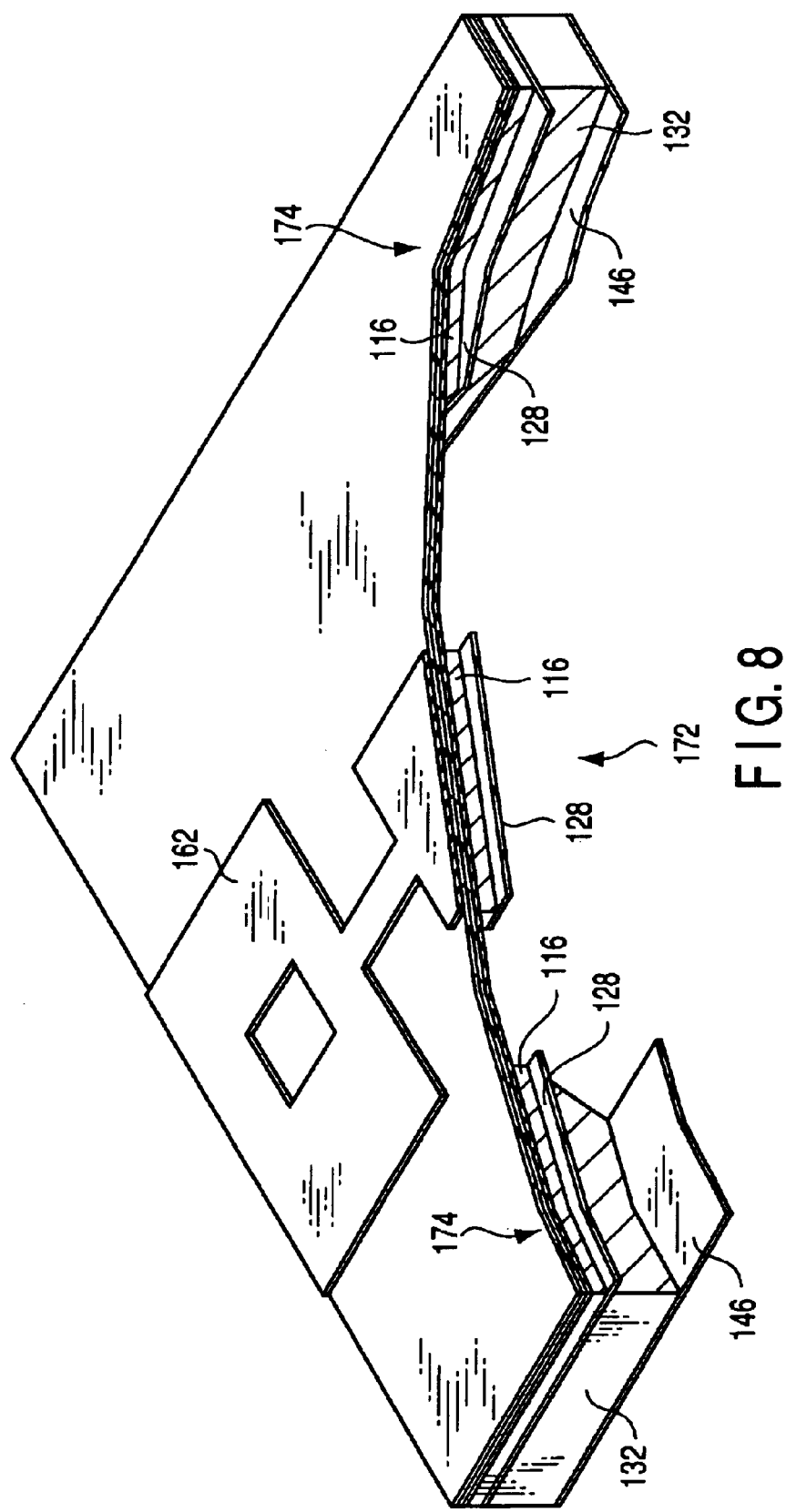
FIG. 8 is a partially sectional perspective view showing that step of the method of manufacturing the oscillator according to the first embodiment which follows the step shown in FIG. 7.
Figure 9:
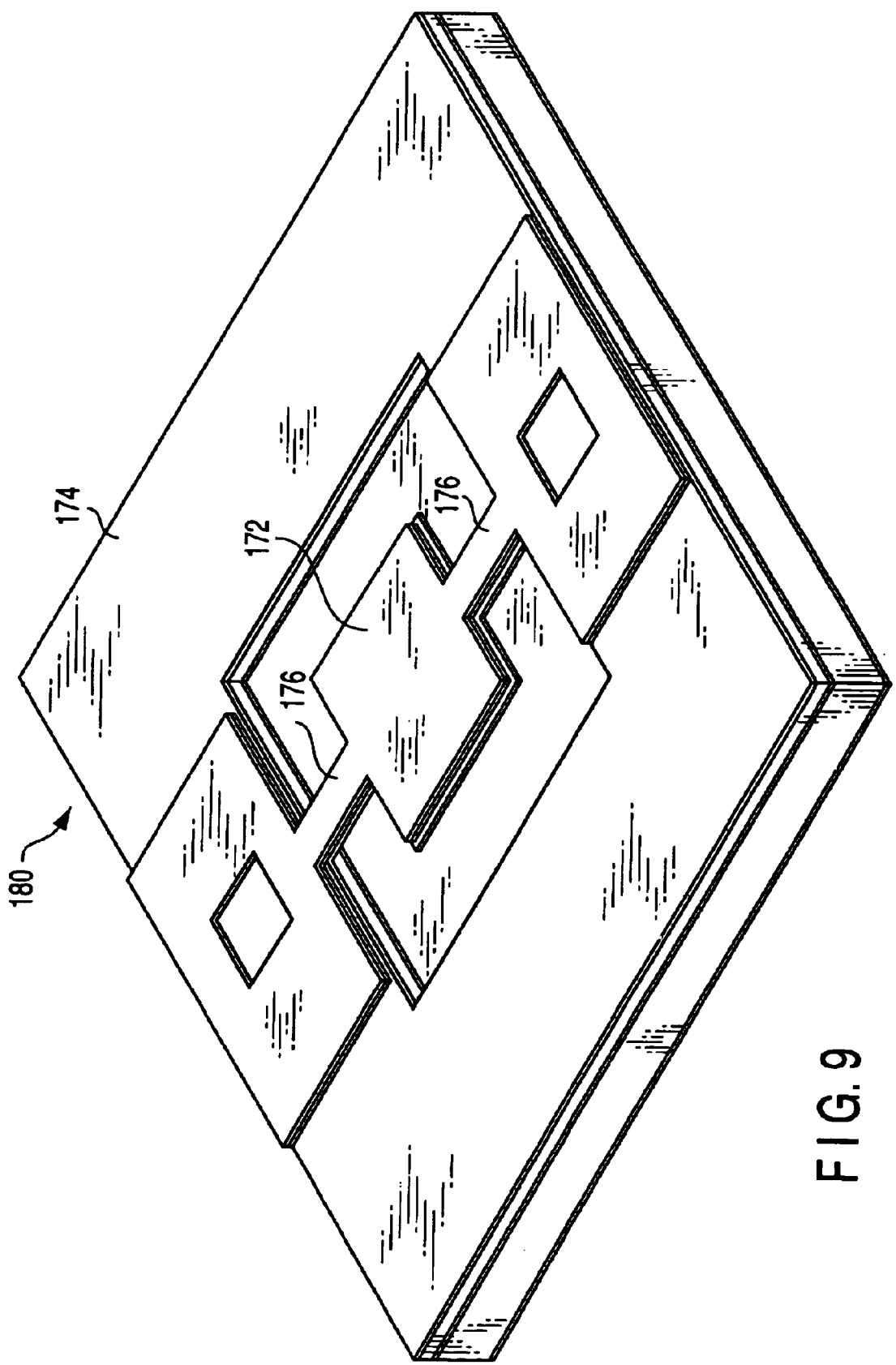
FIG. 9 is a partially sectional perspective view showing that step of the method of manufacturing the oscillator according to the first embodiment which follows the step shown in FIG. 8, and also showing a completed oscillator.

As is apparent from FIG. 8, the thickness of the support frame 174 is substantially equal to the sum of the thickness of the silicon substrate 132 and the thickness active layer 116. The thickness of the movable plate 172 is substantially equal to that of the active layer 116. The silicon nitride film 142 formed during the step shown in FIGS. 5 and 6 serves as an etching stop layer, which shields the coil and the polyimide films from an etchant, after the silicon completely removed by etching during the step shown in FIG. 8.

Then, the polyimide films 154 and 160 are etched through the polyimide etching mask 162 to form torsion springs 176 (see FIG. 9) as elastic members, and openings at the feeding pads 158. Finally, the polyimide etching mask 162, the silicon nitride film 142 remaining between the movable plate 172 and the support frame 174, and the silicon nitride film 146 remaining on the support frame 174 are removed to complete an oscillator 180 for an optical scanner, shown in FIG. 9.

In this embodiment, a laminated structure, which has two silicon processed layers and an inner etching mask provided between the silicon layers, is formed first of all. More specifically, the laminated structure comprises a first silicon layer mainly determining the thickness of the movable plate, a second silicon layer cooperating with the first silicon layer in mainly determining the thickness of the support layer 174, and an inner etching mask positioned between these silicon layers. Then, the laminated structure is etched to produce an oscillator.

Thus, the movable plate 172 and the support frame 174 are formed to have different thicknesses by only one etching process. That is, only the movable plate 172 is formed to be thin. Thus, with the TMAH-based etching, the movable plate can be formed to be very small. Therefore, an oscillator that has a very small movable plate is easily produced.

Further, only the movable plate 172 can be formed to be thin, thereby suppressing a decrease in area of the coil relative to the volume of the movable plate which may otherwise occur as a result of a reduction in size of the movable plate. This serves to provide a scanner that can be efficiently driven.

Furthermore, since only the movable plate 172 is formed to be thin, the distance from the oscillation axis to the position of the center of gravity of the movable plate 172 is reduced. This serves to provide an oscillator that is unlikely to generate unwanted vibration modes.

In the above described embodiment, as described above with reference to FIGS. 1 to 3, a laminated structure, which includes a silicon layer having substantially the same thickness as a movable plate to be formed, an etching mask, and another silicon layer joined to the silicon layer through the etching mask, is formed by joining an SOI substrate provided with the mask 128 to another silicon substrate and then removing a support layer from the SOI substrate by etching. This is because the single silicon substrate that has substantially the same thickness as the movable plate to be formed does not have a sufficient mechanical strength to withstand the process steps of treating the substrate. Accordingly, the SOI substrate comprises an active layer that has substantially the same thickness as the movable plate to be formed and a support layer serving to compensate for the mechanical strength.

Figure 10:
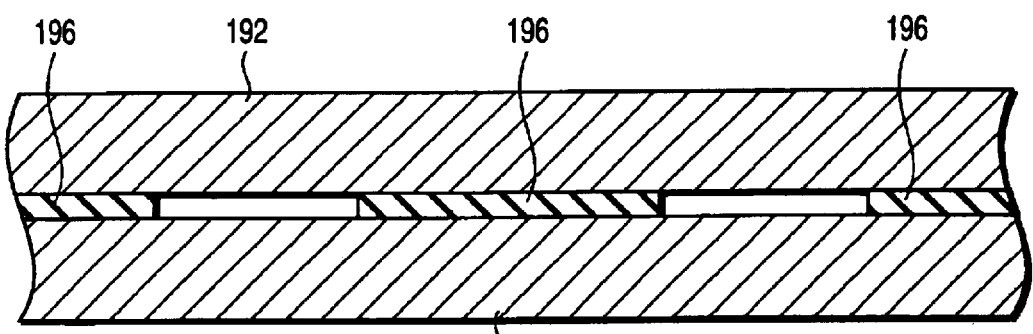
FIG. 10 is a side sectional view showing another step of forming the laminated structure shown in FIGS. 4 and 5.

However, this is not the only method of forming the above described laminated structure. For example, as shown in FIG. 10, the structure may be formed by joining two relatively thick silicon substrates 192 and 194 through a mask 196 and then polishing the silicon substrate 192 until its thickness becomes equal to that of the movable plate to be formed.

Second Embodiment

The above description is directed to production of an oscillator for a scanner. However, this is not the only application of the present invention, but the present invention is applicable to any three-dimensional structure having portions different in thickness. An application of the present invention to the acceleration sensor disclosed in Jpn. Pat. Appln. KOKAI Publication No. 5-264577 will be described as a second embodiment.

Figure 11:
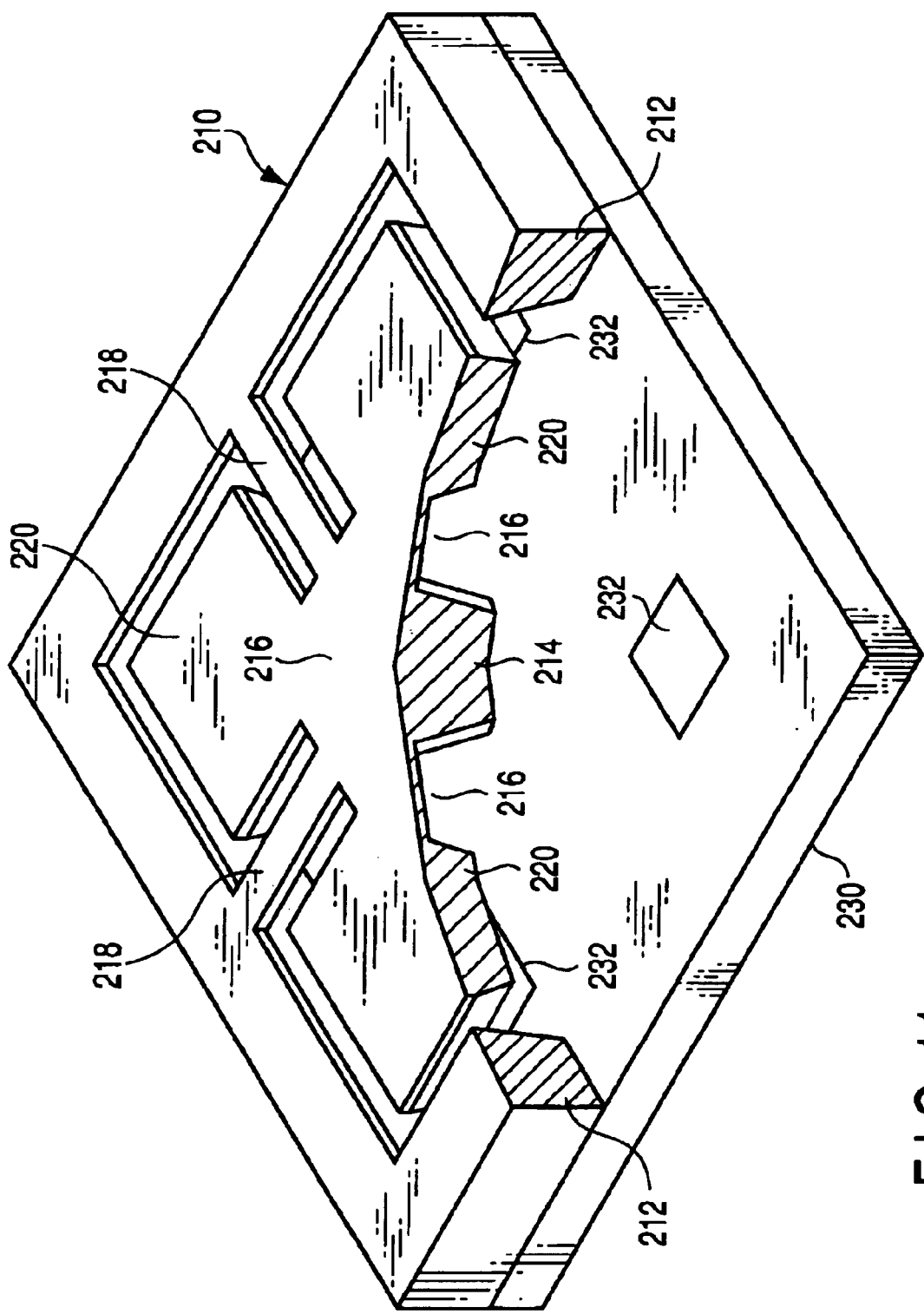
FIG. 11 is a partially sectional perspective view of an acceleration sensor disclosed in Jpn. Pat. Appln. KOKAI Publication No. 5-264577.

This acceleration sensor comprises a silicon structure 210, and a glass substrate 230, as shown in FIG. 11. The silicon structure 210 has a support frame 212, a central support section 214, junctions 218, cantilevers 216, and movable electrodes 220. The glass substrate 230 has fixed electrodes 232, which faces the corresponding movable electrodes 220, respectively.

Figure 12:
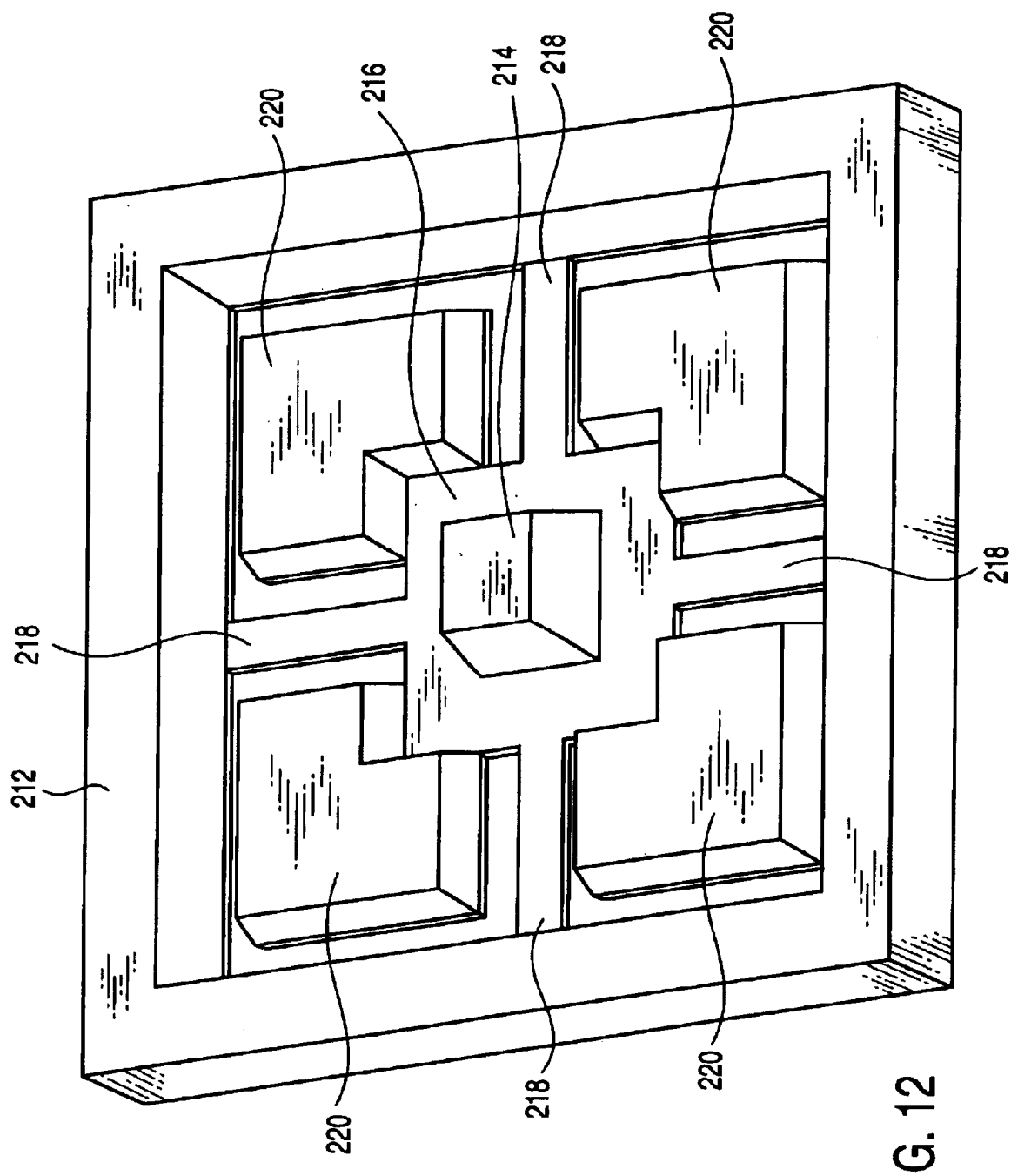
FIG. 12 is a perspective view of a silicon structure shown in FIG. 11, as viewed from a glass substrate thereof.

As shown in FIGS. 11 and 12, the silicon structure 210 has a plurality of portions different in thickness. That is, the support frame 212 and the central support section 214 are thickest, the cantilevers 216 and the junctions 218 are thinnest, and the movable electrodes 220 have an intermediate thickness.

Jpn. Pat. Appln. KOKAI Publication No. 5-264577 does not disclose any method of producing the silicon substrate 210. However, the silicon substrate 210 can be easily produced by applying the present invention thereto. This production process will be described below with reference to FIGS. 13 to 17.

Figure 13:
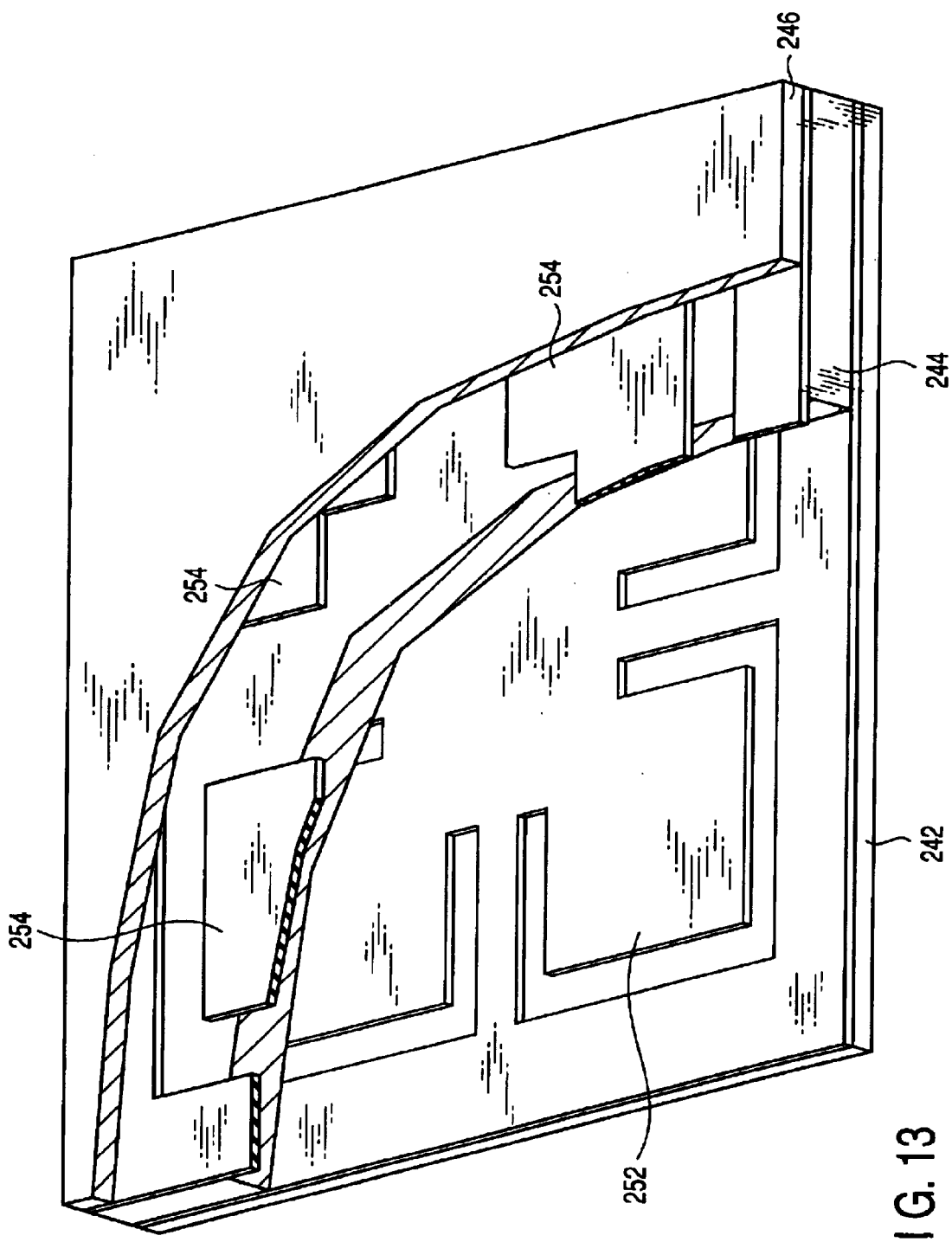
FIG. 13 is a partially sectional perspective view of a laminated structure comprising three silicon layers and two inner masks interposed between these silicon layers, the view showing the first step of a method of manufacturing the silicon structure shown in FIG. 12 according to a second embodiment of the present invention, the silicon structure constituting a three-dimensional structure.

First, as shown in FIG. 13, steps similar to that of the first embodiment are repeated twice, so that silicon substrates 242 and 244 through a mask 252 used to form the cantilevers 216 and the junctions 218, and a silicon substrate 246 is, then, joined to the silicon substrate 244 through a mask 254 used to form the movable electrodes 220. That is, a laminate structure, which comprises the silicon substrates 242, 244, and 246, and the inner masks 252 and 254 interposed between the silicon substrates 242 and 244 and between the silicon substrates 244 and 246, respectively, is formed first of all.

Figure 14:
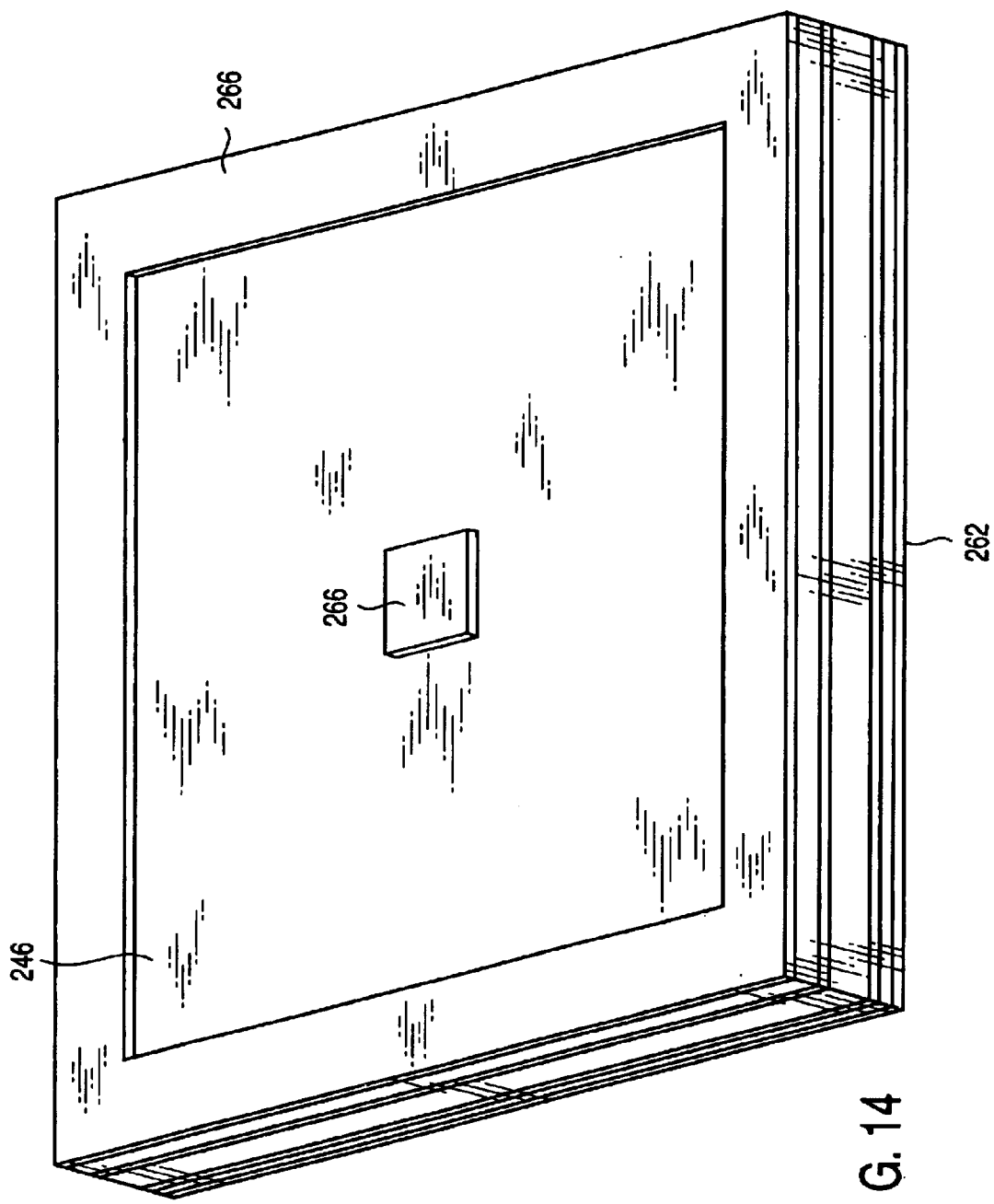
FIG. 14 is a perspective view showing that step of the method of manufacturing the silicon structure according to the second embodiment which follows the step shown in FIG. 13.

Then, oxide films 262 and (266) are formed on the major surfaces (top and bottom surfaces) of the laminated structure obtained through the step shown in FIG. 13, i.e. the non-joint surfaces of the silicon substrates 242 and 246, respectively. Thereafter, as shown in FIG. 14, the oxide film formed on the non-joint surface of the silicon substrate 246 is selectively removed to form an outer mask 266 used to form the support frame 212 and the central support section 214.

Figure 15:
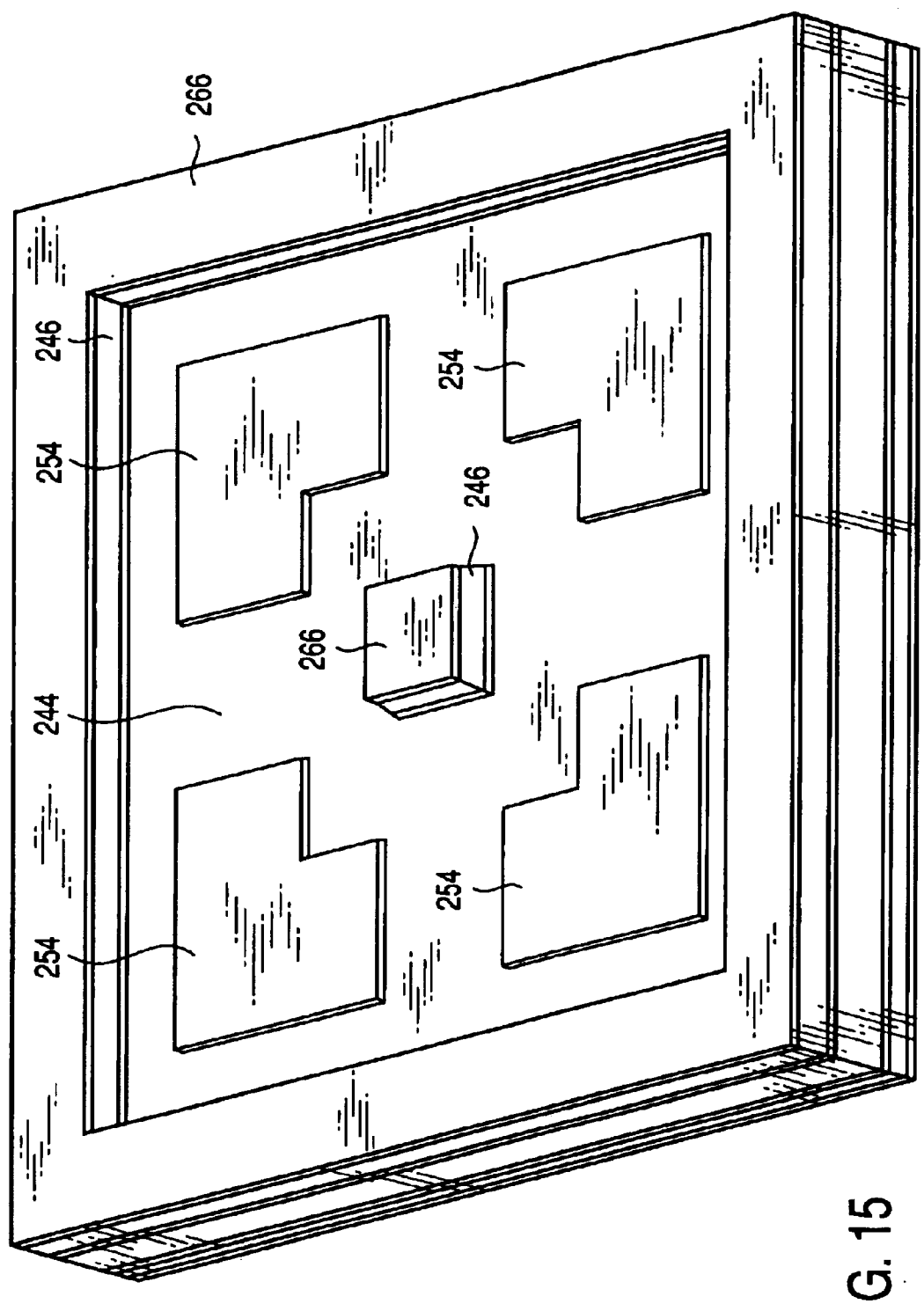
FIG. 15 is a perspective view showing that step of the method of manufacturing the silicon structure according to the second embodiment which follows the step shown in FIG. 14.

Then, the laminated structure is etched through the outer mask 266 with TMAH or the like. As shown in FIG. 14, the silicon substrate 246 includes a portion exposed through the outer mask 266. At first, the exposed portion is selectively removed through the outer mask 266. As the etching proceeds, the inner mask 254 is exposed as shown in FIG. 15, such that the silicon substrate 244 includes a portion exposed through the inner mask 254. Subsequently, the exposed portion is selectively removed through the inner mask 254.

Figure 16:
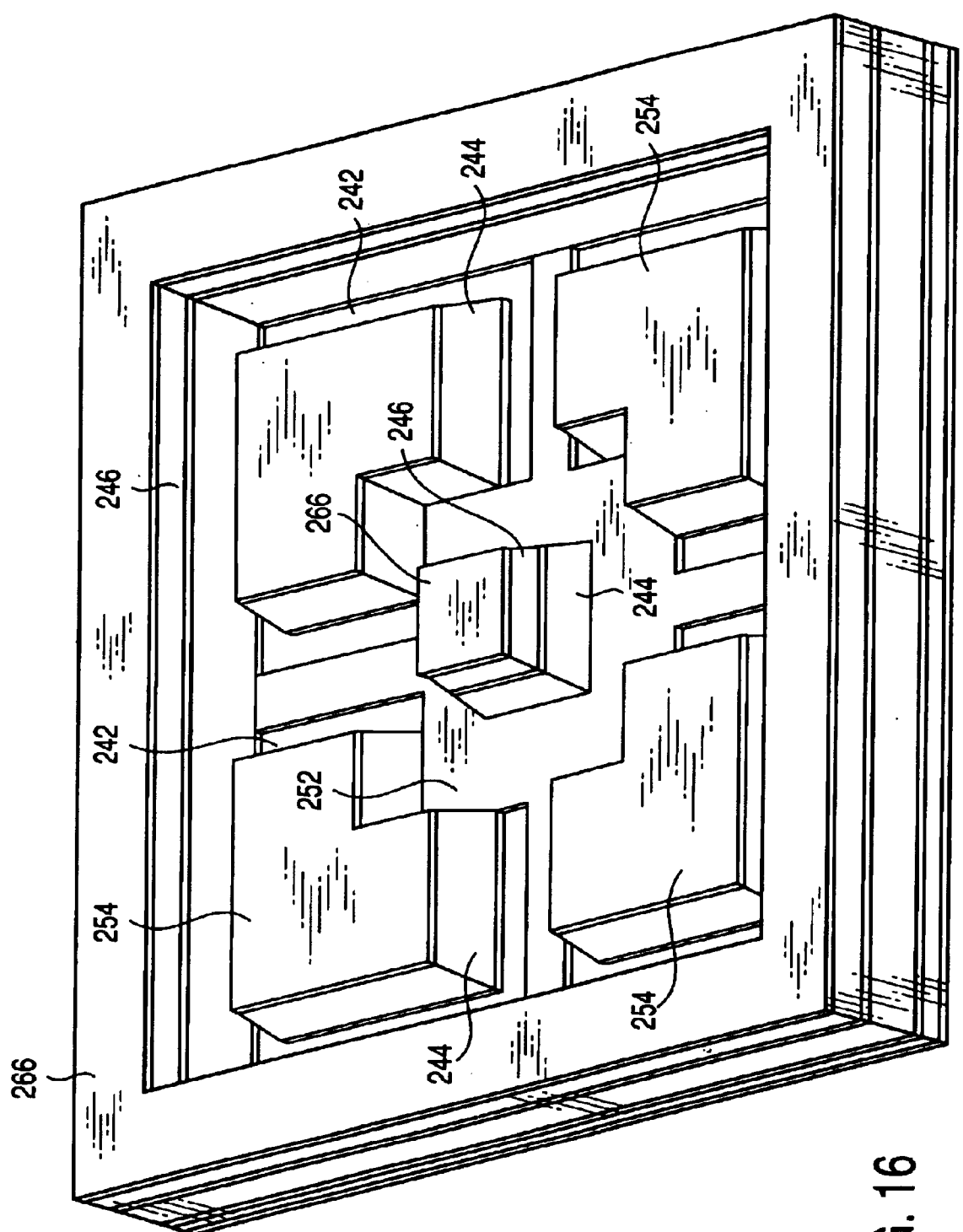
FIG. 16 is a perspective view showing that step of the method of manufacturing the silicon structure according to the second embodiment which follows the step shown in FIG. 15.
Figure 17:
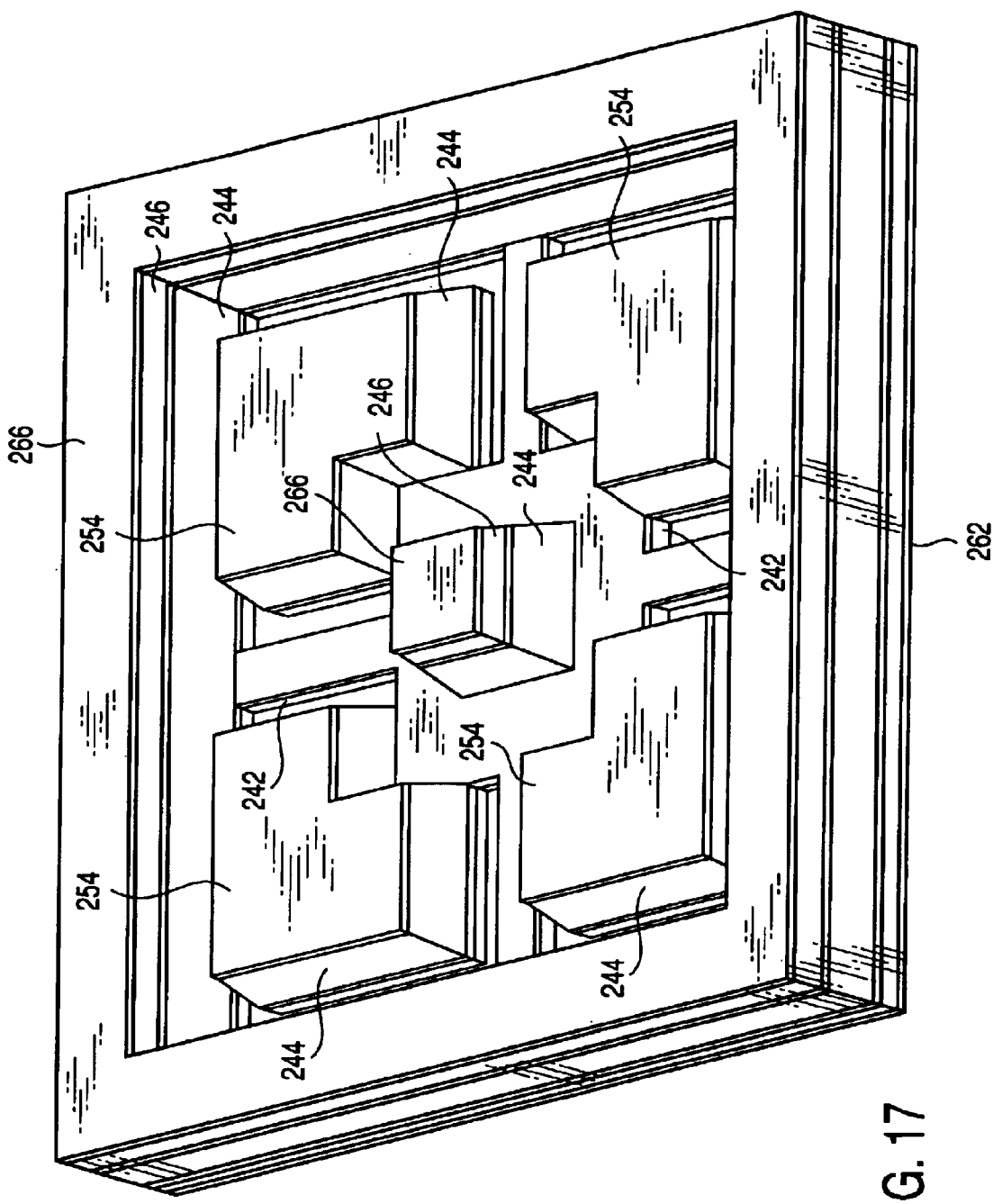
FIG. 17 is a perspective view showing that step of the method of manufacturing the silicon structure according to the second embodiment which follows the step shown in FIG. 16, and also showing a completed silicon structure.
Figure 18:
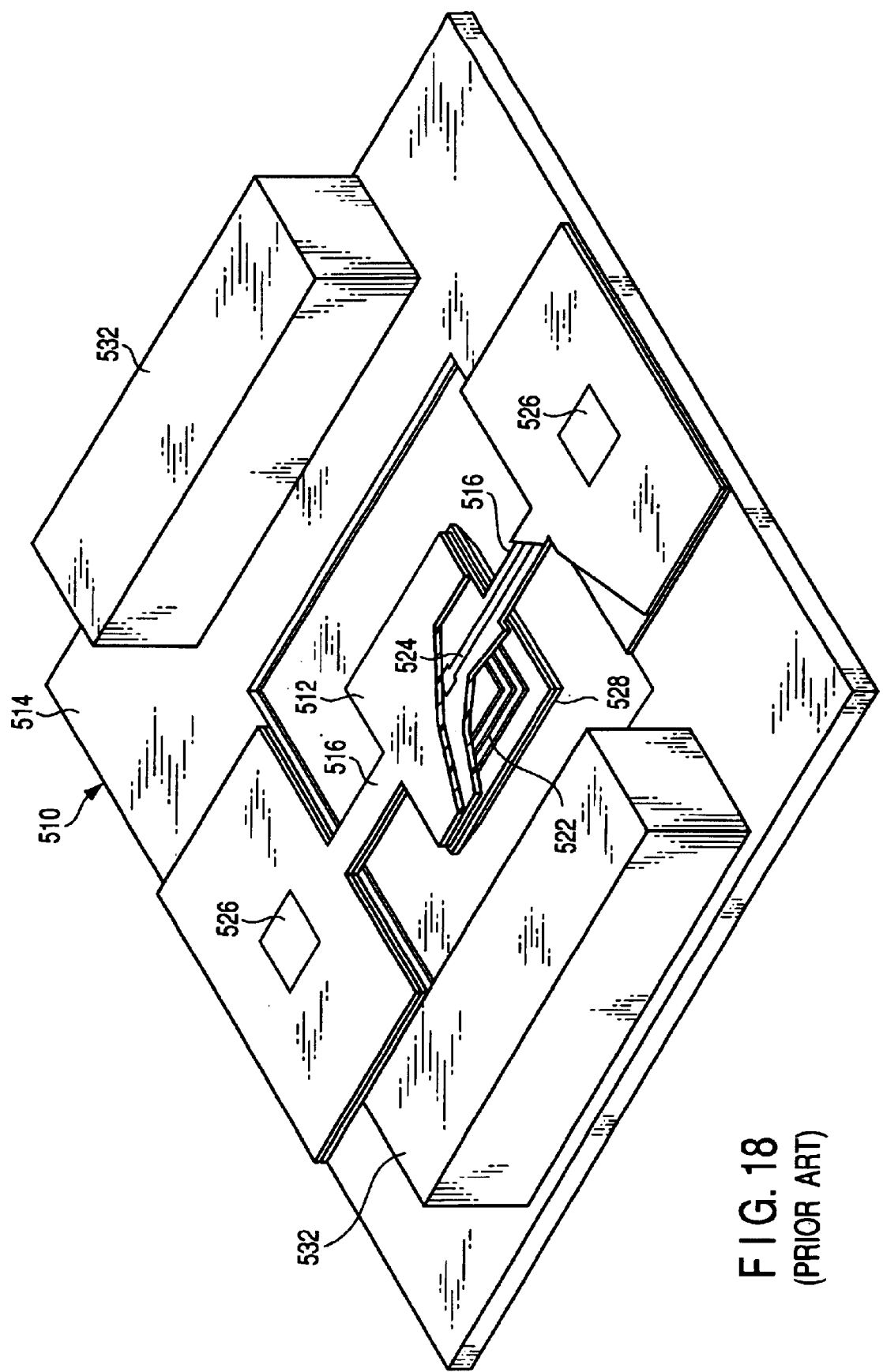
FIG. 18 is a partially sectional perspective view of an optical scanner disclosed in U.S. Pat. No. 6,188,504.
Figure 19:
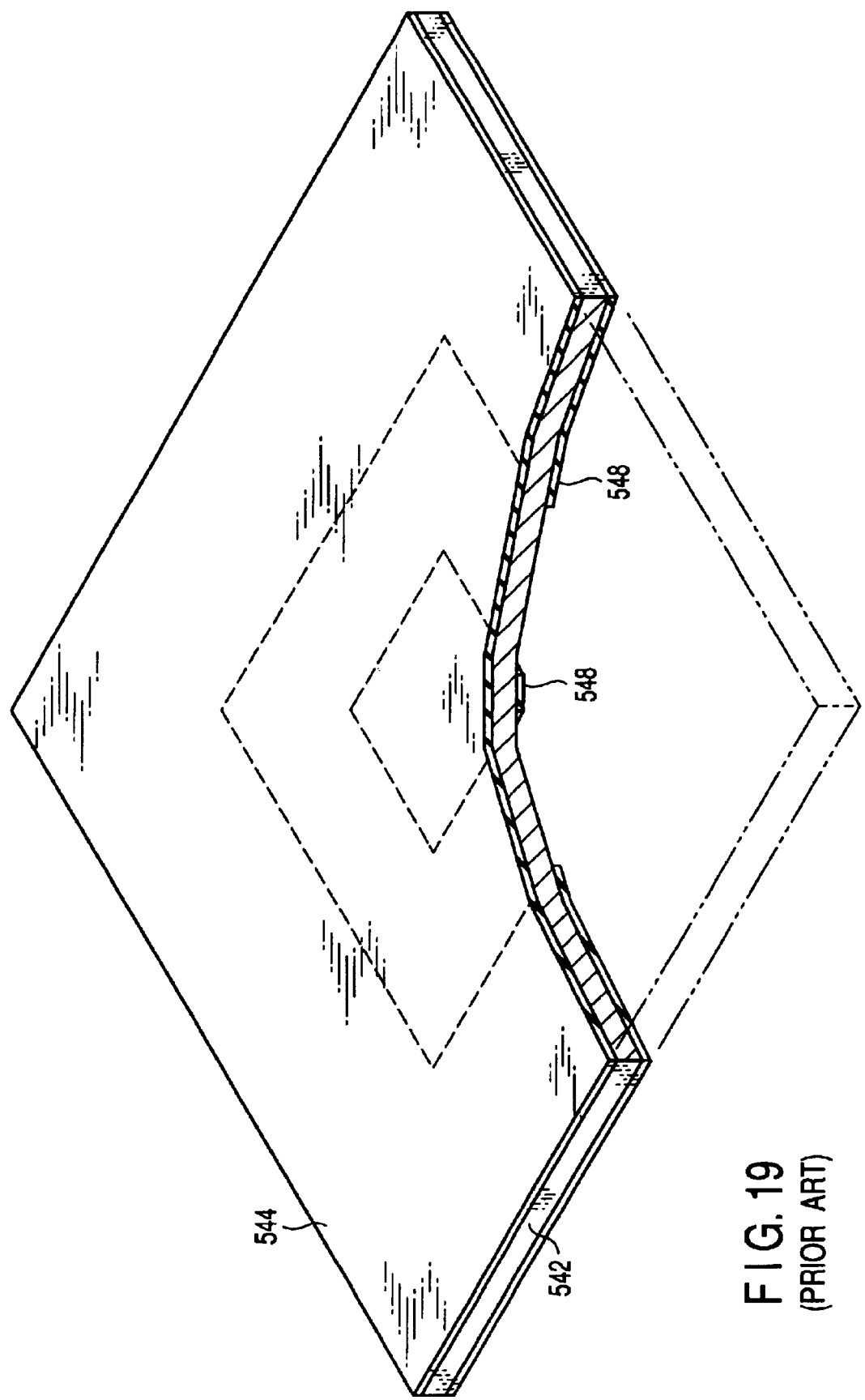
FIG. 19 is a partially sectional perspective view showing the first step of a method of manufacturing a conventional oscillator included in the optical scanner in FIG. 18.
Figure 20:
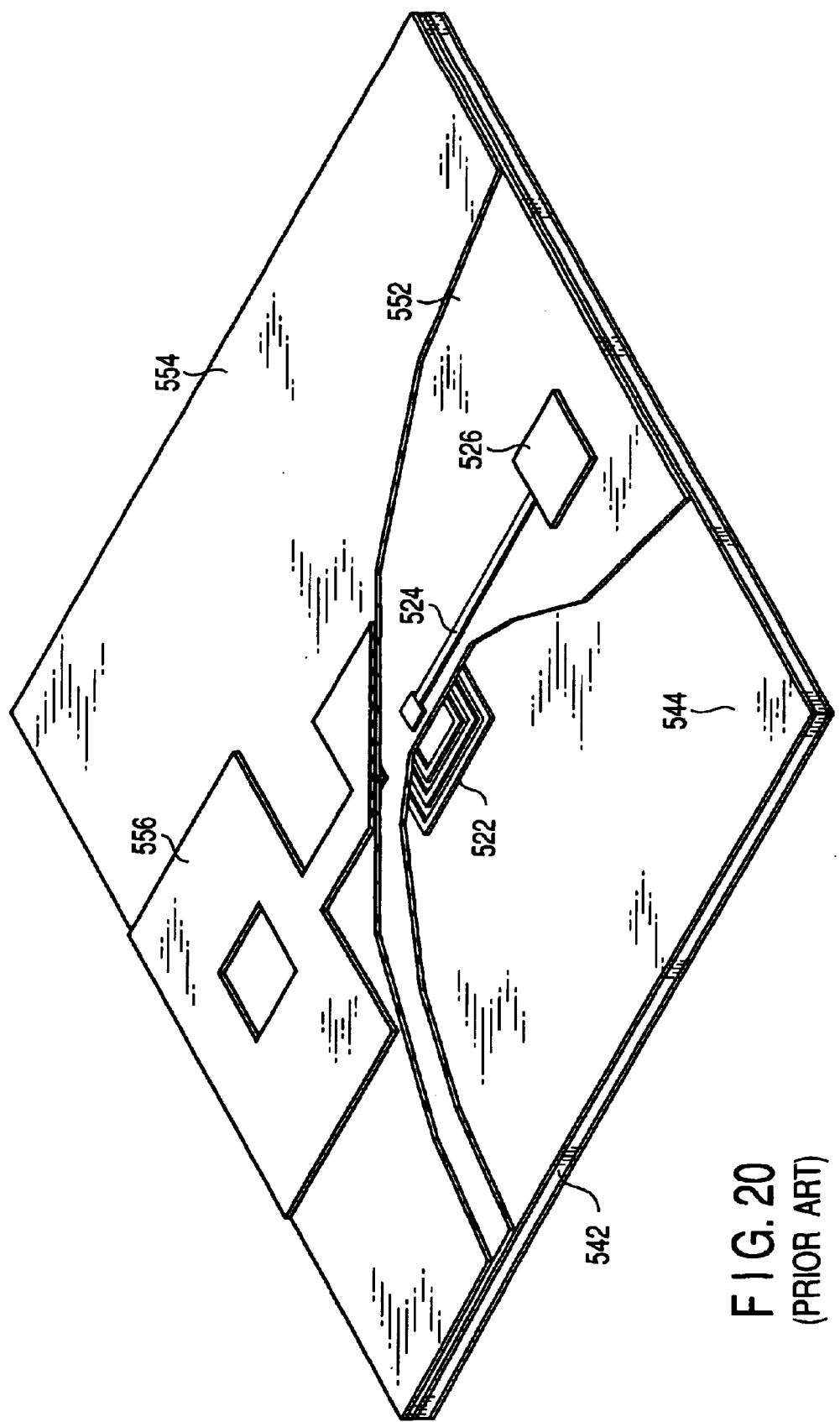
FIG. 20 is a partially sectional perspective view showing that step of the method of manufacturing the conventional oscillator which follows the step shown in FIG. 19.
Figure 21:
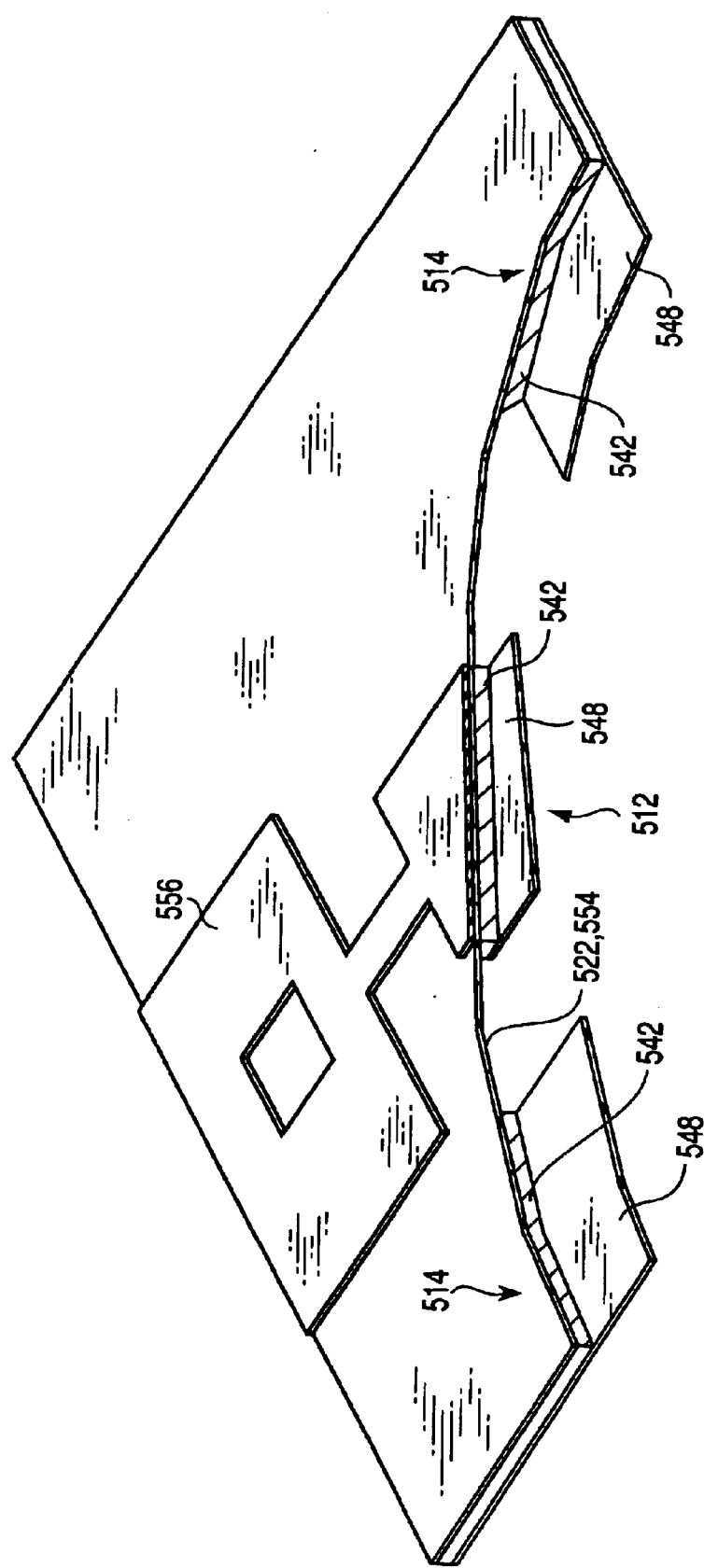
FIG. 21 is a partially sectional perspective view showing that step of the method of manufacturing the conventional oscillator which follows the step shown in FIG. 20.
Figure 22:
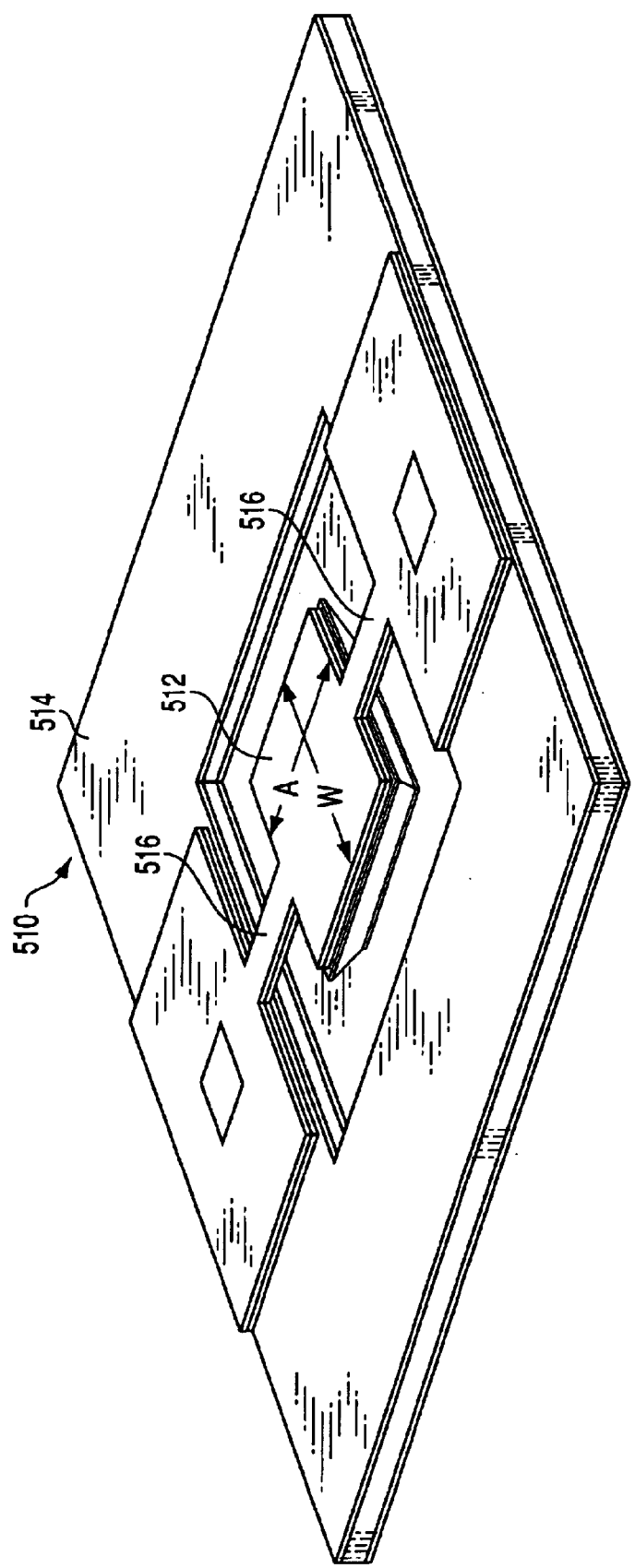
FIG. 22 is a perspective view of a completed conventional oscillator obtained after the step shown in FIG. 21.
Figure 23:
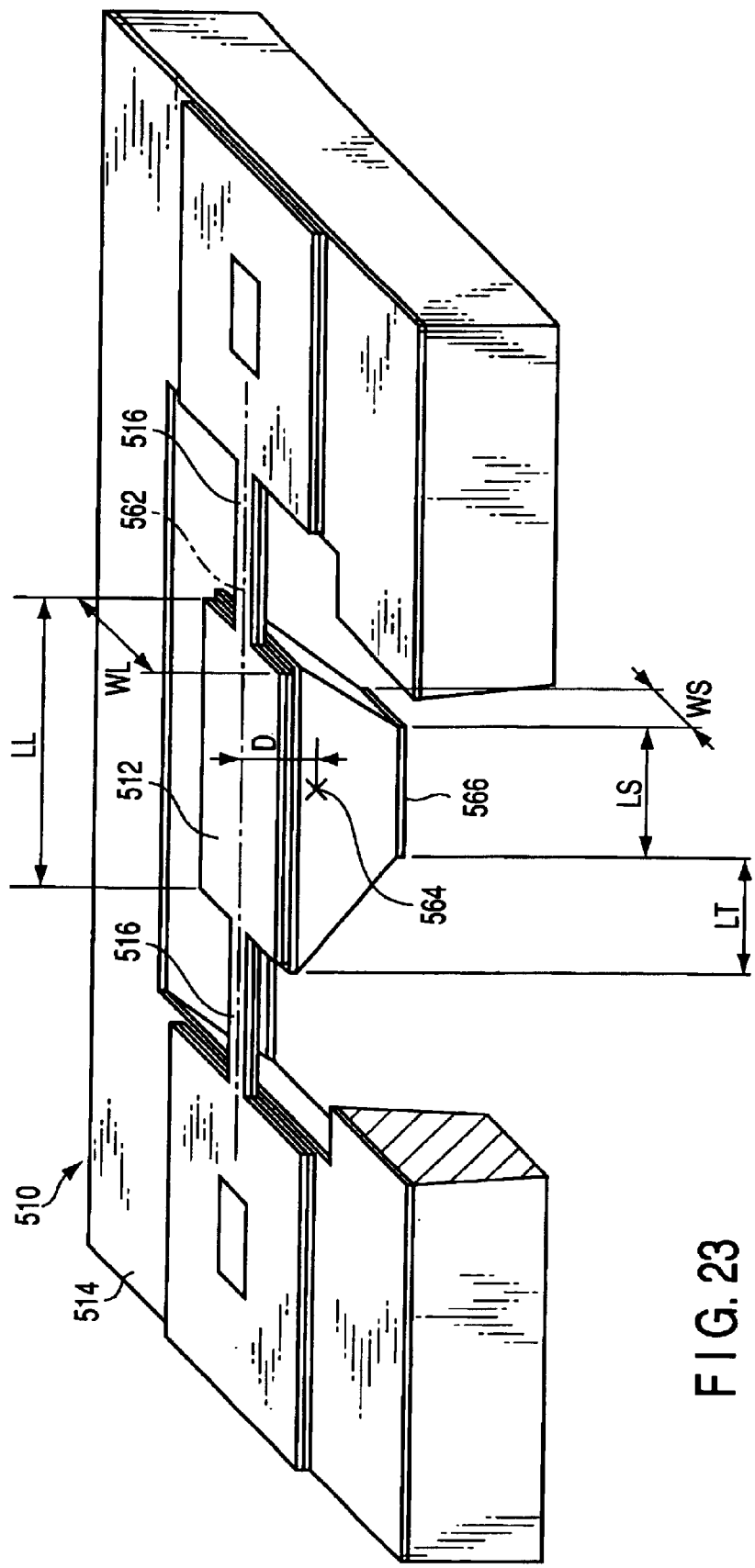
FIG. 23 is a partially sectional perspective view of the conventional oscillator having a miniaturized movable plate.

As the etching further proceeds, the inner mask 252 is exposed as shown in FIG. 16, such that the silicon substrate 242 includes a portion exposed through the inner mask 252. Subsequently, the exposed portion is selectively removed through the inner mask 252. As a result, the structure shown in FIG. 17 is finally obtained.

Finally, the oxide film 262 and the masks 252, 254, and 266 are removed with hydrofluoric acid or the like, so that the silicon structure 210 is produced, the structure having a plurality of portions different in thickness, i.e. the support frame 212 and central support section 214, which are thickest, the movable electrodes 220, which have an intermediate thickness, and the junctions 218 and cantilevers 216, which are thinnest.

This silicon structure 210 is joined to the glass substrate 230 having the fixed electrodes 232 formed thereon, so that the fixed electrodes 232 face the corresponding movable electrodes 220, thereby completing an acceleration sensor.

In this embodiment, a laminated structure, which comprises silicon layers and inner etching masks interposed between the layers, is formed first of all. More specifically, the laminated structure comprises a first silicon layer mainly determining the thickness of the junctions 218 and the cantilevers 216, a second silicon layer cooperating with the first silicon layer in mainly determining the thickness of the movable electrodes 220, a third silicon layer cooperating with the first and second silicon layers in mainly determining the thickness of the support frame 212 and the central support section 214, an etching mask positioned between the first and second silicon layers, and an etching mask positioned between the second and third silicon layers. Then, the laminated structure is etched to produce the silicon structure 210 for an acceleration sensor.

Thus, the support frame 212 and central support section 214, which are thickest, the movable electrodes 220, which have an intermediate thickness, and the junctions 218 and cantilevers 216, which are thinnest, are formed by only a single etching process. This enables easy production of a three-dimensional structure having portions different in thickness.

Also in this embodiment, a laminated structure including etching masks may be formed by joining two silicon wafers through a mask instead of SOI substrates and then polishing one of the silicon substrates until its thickness reaches an appropriate value, as in the first embodiment. In the second embodiment, the wet etching process with TMAH or the like is used to etch the silicon substrates. However, a dry etching process may be used provided that oxide masks can be used as masks.

The several embodiments have been specifically described with reference to the drawings. However, the present invention is not limited to the above described embodiments but includes all implementations that do not deviate from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a three-dimensional structure having portions different in thickness, the method comprising:

forming a laminated structure, which comprises at least two layers to be processed and at least one inner mask interposed between the layers, the layers and the inner mask being joined together, such that the laminated structure has top and bottom major surfaces;

forming an outer mask on at least one of the major surfaces of the laminated structure;

selectively etching the layers from one of the major surfaces of the laminated structure through the outer mask to expose the inner mask and then through the inner mask and selectively etching the layers through at least one opening portion of the inner mask after the inner mask is exposed, so that the portions different in thickness are formed by one etching process.

2. A method of manufacturing a three-dimensional structure according to claim 1, wherein the layers are of silicon, and the inner mask comprises a silicon oxide film.

3. A method of manufacturing a three-dimensional structure according to claim 1, wherein the laminated structure comprises a further inner mask provided on one of the layers, and a further layer to be processed provided on the further inner mask.

4. A method of manufacturing a three-dimensional structure according to claim 1, wherein formation of the laminated structure comprises providing an SOI substrate, which has a support layer, a buried oxide film layer, and an active layer, the layers being joined together, such that the SOI substrate has top and bottom major surfaces, and the active layer has an outer surface as one of the major surfaces of the SOI substrate, forming a mask on the outer surface of the active layer, joining a silicon substrate to the SOI substrate through the mask formed, and removing the support layer from the SOI substrate, whereby the resulting structure includes the active layer and the silicon substrate as the two layers to be processed, and the mask as the inner mask.

5. A method of manufacturing a three-dimensional structure according to claim 1, wherein formation of the laminated structure comprises providing a silicon substrate, which has top and bottom major surfaces, forming a mask on one of the major surfaces of the silicon substrate, and joining the silicon substrate to another substrate through the mask formed, whereby the resulting structure includes the silicon substrates as the two layers to be processed, and the mask as the inner mask.

6. A method of manufacturing as oscillator comprising a support, a movable plate having a reflecting surface, and elastic members connecting the movable plate and the support, the oscillator cooperating with a driver, which oscillates the movable plate with respect to the support, to constitute an optical scanner, which scans a beam of light reflected by the reflecting surface of the movable plate, the method comprising:

forming a laminated structure, which comprises two layers to be processed and an inner mask interposed between the layers, the layers and the inner mask being joined together, such that the laminated structure has top and bottom major surfaces;

forming an outer mask on at least one of the major surfaces of the laminated structure;

selectively etching the layers from one of the major surfaces of the laminated structure through the outer mask to expose the inner mask and then through the inner mask, so that the portions different in thickness are formed by one etching process, the portions including a relatively thick portion serving as a support, and relatively thin portion as a movable plate.

7. A method of manufacturing an oscillator comprising supports, movable electrodes, and levers connecting the movable electrodes and the supports, so that the movable electrodes is allowed to oscillate with respect to the supports, the oscillator cooperating with fixed electrodes facing to the movable electrodes to constitute an acceleration sensor for sensing acceleration, the method comprising:

forming a laminated structure, which comprises three layers to be processed and two inner masks interposed between the layers, the layers and the inner masks being joined together, such that the laminated structure has top and bottom major surfaces;

forming an outer mask on at least one of the major surfaces of the laminated structure;

selectively etching the layers from one of the major surfaces of the laminated structure through the outer mask to expose the inner mask and then through the inner mask, so that portions different in thickness are formed by one etching process, the portions including relatively thick portions serving as supports, intermediate-thickness portions as movable electrodes, and relatively thin portions as levers.

* * * * *